United States Patent [19]

Yonezawa et al.

[11] Patent Number: 5,008,534
[45] Date of Patent: Apr. 16, 1991

[54] CONTACTLESS SWITCH HAVING TRANSLATING FOCUSING/DEFOCUSING LENS

[75] Inventors: Tatsushi Yonezawa, Takatsuki; Satosi Nozoe, Kyoto, both of Japan

[73] Assignee: Omron Tateisi Electronics Co., Kyoto, Japan

[21] Appl. No.: 400,654

[22] Filed: Aug. 30, 1989

[51] Int. Cl.$^5$ ............................................... G01D 5/34
[52] U.S. Cl. ............................ 250/229; 250/231.19; 341/31
[58] Field of Search .............. 250/229, 237 R, 231.19; 341/31

[56] References Cited

U.S. PATENT DOCUMENTS

| | | | |
|---|---|---|---|
| 3,993,900 | 11/1976 | Hulme | 250/229 |
| 4,607,161 | 8/1986 | Anderson et al. | 250/229 |
| 4,868,384 | 9/1989 | Franken et al. | 250/229 |

*Primary Examiner*—David C. Nelms
*Assistant Examiner*—Khaled Shami
*Attorney, Agent, or Firm*—Fish & Richardson

[57] ABSTRACT

A contactless switch comprising a moveable body assembly including a plunger and a lens carrier received in a casing axially slidable manner between a light emitting element and a light receiving element which are also disposed along and on the axial line of the casing. Thus, the radial dimension of the switch can be reduced, and a compact design is made possible. Additionally, the actuating stroke of the moveable body assembly can be made large without increasing the dimensions of the switch. In particular, since a switch output can be produced from a signal processing circuit when the amount of the light received by the light receiving element has reached a certain predetermined level, the point of activation of the switch can be accurately defined by adjusting a reference level for the level of the light received by the light receiving element, and this adjustment can be easily carried out.

14 Claims, 10 Drawing Sheets

CONTACTLESS SWITCH HAVING TRANSLATING FOCUSING/DEFOCUSING LENS

TECHNICAL FIELD

The present invention relates to contactless switches using photoelectric elements.

BACKGROUND OF THE INVENTION

According to a conventionally known switch of this kind, a light emitting element and a light receiving element are disposed laterally opposite to each other in a casing, and a plunger having a light shield is received in the casing in an axially slidable manner. The plunger is normally urged outwardly by a return spring and a light beam produced from the light emitting element can reach the light receiving element. When the plunger is depressed against the biasing force of the return spring, the light shield obstructs the path of the light beam, and relatively less light is projected upon the light receiving element. By detecting the output level of the light receiving element, the mechanical state of the plunger may be detected without using any contacts which would be subjected to wears.

However, according to this structure, since the light shield moves across the path of the light beam, the plunger necessarily extends perpendicularly with respect to the light beam, and the dimensions thereof in these two directions tend to be large.

Further, since the switch output is obtained by the light shield shutting off the light beam, if the diameter of the light beam is large, it takes some time before the light beam is completely shut off by the light shield, and the response speed of the switch output is delayed. Conversely, if the diameter of the light beam is small, the actuation stroke of the plunger would be reduced, and this is not favorable because the point of activation of the switch cannot be accurately determined and it becomes difficult to exactly adjust how far the plunger is required to be depressed for a switch output to be produced.

Furthermore, according to such a contactless switch, only one switch output can be obtained by using a combination of a light emitting element, a light receiving element and a light shield. Therefore, when it is desired to obtain switch outputs at a plurality of points in the stroke of the plunger, a corresponding number of combinations of a light emitting element, a light receiving element and a light shield are required.

Also, in some applications, it is desired to achieve a certain linearity between the stroke of the plunger and the output level of the switch but none of the commercially available contactless switches can provided any such desired linearity.

BRIEF SUMMARY OF THE INVENTION

In view of such problems of the prior art, a primary object of the present invention is to provide a contactless switch which is simple and compact.

A second object of the present invention is to provide a reliable contactless switch which can operate in stable manner over its entire service life.

A third object of the present invention is to provide a contactless switch which can produce switch outputs at different points of the stroke of its plunger or its mechanical input member.

A fourth object of the present invention is to provide a contactless switch which provides a favorable linearity between its machanical input and its electric output.

These and other objects of the present invention can be accomplished by providing a contactless switch, comprising: a casing defining an axial bore; a light emitting element disposed in the bore to produce a light beam directed in an axial direction of the axial bore; a light receiving element disposed in the bore opposite to the light emitting element defining a certain axial space therebetween; a lens carrier carrying a lens element and interposed between the light emitting element and the light receiving element in an axially slidable manner; and a plunger member having one end projecting axially out of one of axial ends of the casing and another end engaging with the lens carrier. Preferably, biasing means is provided in the casing for urging the lens carrier towards the one axial end of the casing.

According to a preferred embodiment of the present invention, one of the light emitting element and the light receiving element is attached to a partition wall provided in the bore of the casing, and the other of the light emitting element and the light receiving element is attached to an end wall attached to the other axial end of the casing, the plunger being provided with a plurality of legs which are passed through associated openings provided in the partition wall and abut peripheral parts of the lens carrier. Most preferably, the inner wall surface of the casing is provided with axial grooves for guiding tabs radially projecting from the lens holder.

According to this invention, since a moveable body assembly including the plunger and the lens carrier moves along the axial line on and along which the light emitting element and the light receiving element are disposed, the dimensions of the switch in directions perpendicular to the axial line can be reduced, and a compact design is made possible. Additionally, the actuating stroke of the moveable body assembly can be made large without increasing the dimensions of the switch. In particular, since the switch output can be produced from a signal processing circuit when the amount of the light received by the light receiving element is at a certain predetermined level, the point of activation of the switch can be accurately defined by adjusting a reference level of the received light, and this adjustment can be easily carried out.

To achieve a stable movement of the lens carrier, a compression coil spring may be interposed between a spring seat provided in a part of the casing adjacent the other axial end of the bore, and another spring seat provided in a part of the lens carrier, the spring seat of the lens carrier being closer to the one axial end of the bore than the peripheral parts of the lens casing where the legs of the plunger abut. If an external end of the plunger and parts of the legs of the plunger abutting the peripheral parts of the lens carrier are located on the surface of a common imaginary sphere, the lens carrier may be free from any play and can move smoothly even when the plunger involves some lateral play.

To ensure mechanical rigidity of the contactless switch and simplify the assembly process without requiring any severe tolerance control, it is preferred to use an outer housing for axially receiving the casing, the casing directly abutting an inner end surface of the outer housing at one of its axial ends and abutting another inner end surface of the outer housing at the other of its axial ends by way of a deformable elastic member. Preferably, the casing is provided with a plurality of axial ridges on its outer surface to ensure its mechanical rigidity and smooth movements of the internal moving parts accommodated in the casing.

To improve the adaptability of the contactless switch to various applications, it may include a detachable control unit, which may be detachably coupled with a main part of the contactless switch, comprising a connector for electrically connecting with output leads of the light receiving element, a comparator for comparing an output from the light receiving element with a threshold level, and an output circuit for producing on ON-OFF signal according to an output from the comparator. In this way, simply by changing the control unit but using the same main part of the contactless switch for different applications, the burden of stocking a wide variety of contactless switches may be relieved. In particular, it is preferable that the comparator is provided with means for adjusting the threshold level.

Also, the signal processing circuit may comprise a plurality of comparators having different threshold levels, which may be individually adjustable, and output circuits associated therewith.

According to another embodiment of the present invention, the contactless switch, comprises a casing defining an axial bore; a light emitting element and a light receiving element disposed at one axial end of the bore; and mirror member disposed in the bore opposite to the light emitting and receiving elements defining a certain axial space therebetween; a moveable member rotatably received in the bore and having slit means interposed between the mirror member and the light emitting and receiving elements, an opening area of the slit mean being varied depending on rotative position of the moveable member by cooperating with a stationary member; a plunger member having one end projecting axially out of the other axial end of the bore and slidably received in the bore; and conversion means for converting an axial movement of the plunger member to a rotative movement of the moveable member. Preferably, the moveable member is interposed between a wall member carrying the mirror member and an end wall of the bore carrying said light emitting element and the light receiving element in rotatable manner, and provided with spiral grooves which engage associated legs provided in an internal end of the plunger member.

According to this embodiment, it is possible to obtain switch outputs at a plurality of points of the stroke of the plunger. To eliminate backlash from the moveable member, biasing means may be used for urging the moveable member towards its neutral position corresponding to a fully projected position of the plunger member out of the one axial end of the casing.

BRIEF DESCRIPTION OF THE DRAWINGS

Now the present invention is described in the following in terms of specific embodiments with reference to the appended drawings, in which.

DETAILED DESCRIPTION OF THE PREFERRED EMBODIMENTS

Figure 1:
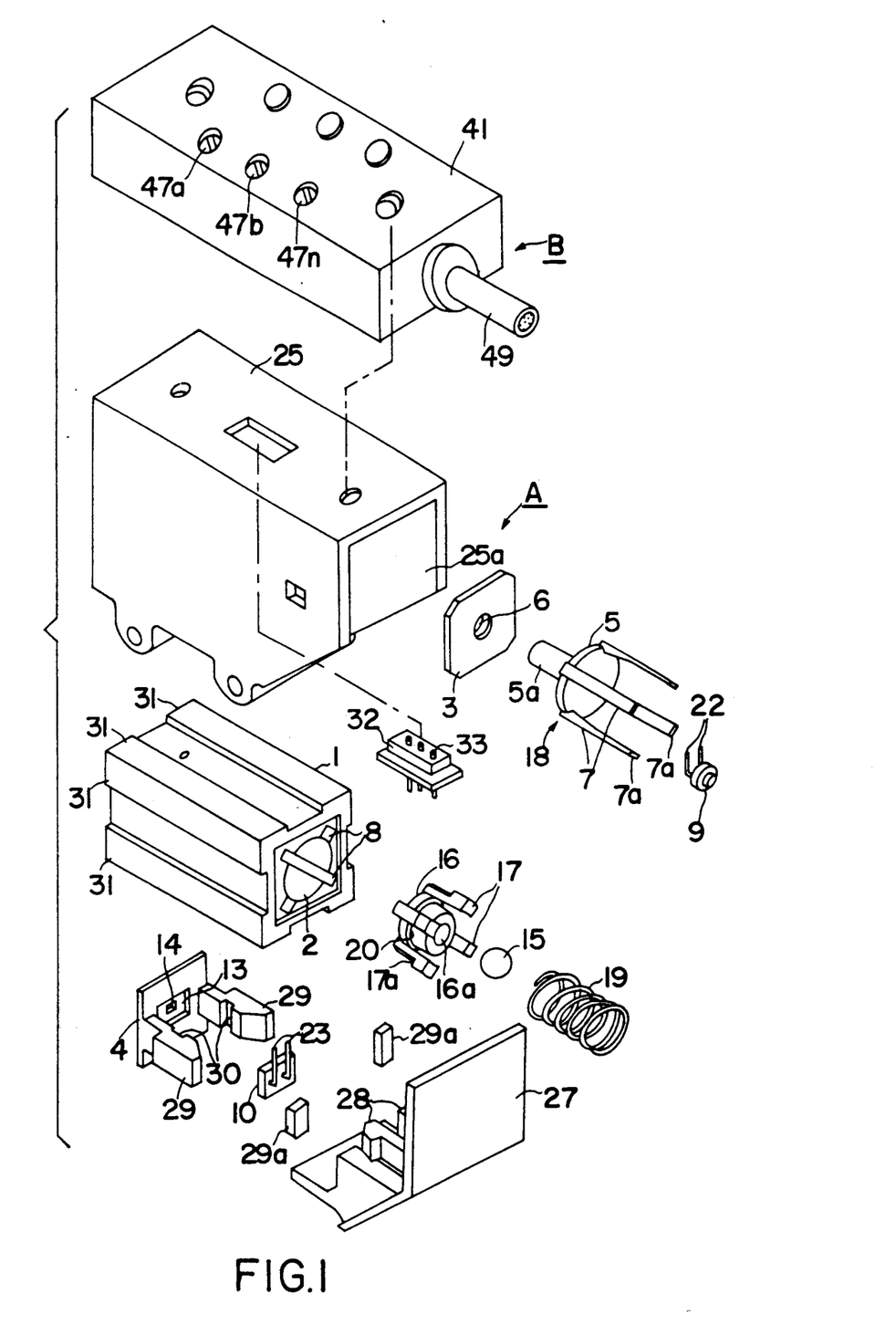
FIG. 1 is an exploded perspective view of a first embodiment of the contactless switch according to the present invention.
Figure 2:
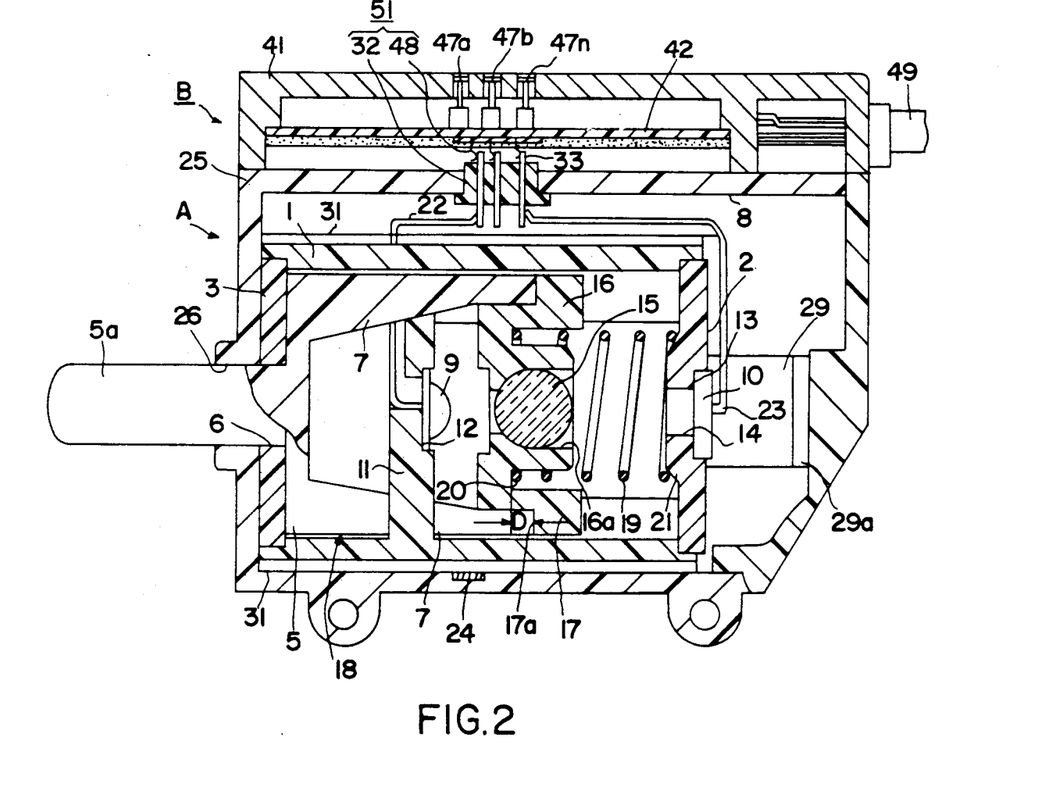
FIG. 2 is a longitudinal sectional view of the contactless switch shown in FIG. 1.

FIGS. 1 and 2 are an exploded perspective view and a sectional view of an embodiment of the contactless switch according to the present invention.

In these drawings, numeral 1 denotes a tubular switch main body made of synthetic resin or the like, which is given with a rectangular external shape and is provided therein with a circular bore 2 which is closed at its both axial ends by front and rear lids 3 and 4, respectively.

Numeral 5 denotes a plunger made of synthetic resin or the like which is disposed along the axial line of the switch main body 1. The front end of the plunger 5 is integrally provided with a columnar actuation part 5a projecting outwardly through an opening 6 provided in the front lid 3, and four elastic legs 7 arranged at equal interval along the outer circumferential surface of the plunger 5 extend axially so as to be fitted into associated four guide grooves 8 provided in the inner circumferential surface of the switch main body 1 along the axial direction.

Numerals 9 and 10 denote a light emitting element and a light receiving element, respectively. The light emitting element 9 is fixedly secured to a recess 12 (FIG. 2) provided in a partition wall 11 provided in the switch main body 1, and the light receiving element 10 is fixedly secured to a recess 13 provided on the external surface of the rear lid 4. Numeral 14 denotes a light receiving window provided in the recess 13.

Numeral 15 denotes a ball lens dispose on the axial line between the light emitting element 9 and the light receiving element 10, and numeral 16 denotes a lens holder retaining the ball lens 15 at its opening 16a. This lens holder 16 is slidably received in the switch main body 1 by fitting substantially L-shaped four tabs 17, which are formed around the lens holder 16 at equal interval, into rear parts of the guide grooves 8, and the free ends of the elastic legs 7 abut shoulder portions 17a of these tabs 17. The lens holder 16 and the plunger 5 jointly form a moveable body assembly 18.

Numeral 19 denotes a return coil spring for imparting a restoring force to the moveable body assembly 18, and this coil spring 19 extends across an annular spring seat portion 20 formed on the outer periphery of the lens holder 16 and another spring seat portion 21 formed in the inner surface of the read lid 4. The position at which the free end surfaces 7a of the elastic legs 7 of the plunger 5 about the shoulder portions 17a of the tabs 17 is selected to be behind the position of the spring seat portion 20 of the lens holder 16, which one end of the return coil spring 19 abuts, by a distance D (FIG. 2).

In the drawings, numerals 22 and 23 denote leads for the light emitting element 9 and the light receiving element 10, and numeral 24 denotes a light receiving element provided on the inner surface of the switch main body 1 to monitor the amount of light emission from the light emitting element 9 and controls its intensity to a constant level.

Numeral 25 denotes an outer casing made of synthetic resin which is adapted to be fitted axially upon the switch main body 1 to keep dust away therefrom, and its front end surface is provided with a through hold 26 for passing the actuation portion 5a of the plunger 5 therethrough while its rear end opening 25a is closed by a cover 27. Numeral 28 denotes engagement pieces projecting from the inner surface of the cover 27 so as to be detachably engaged with engagement recesses 30 provided in arms 29 extending from the outer surface of the rear lid 4.

As shown in FIGS. 1 and 2, a pair of elastic pieces 29a made of rubber-like material are interposed between the free end surfaces of the arms 29 and the inner end surface of the cover 27 while the front lid 3 of the switch main body 1 directly abuts the inner surface of the outer casing 25. Thus, the direct abutment between the outer casing 25 and the front lid 3 of the switch main body 1 ensures an accurate positioning of the switch main body 1 in the outer casing 25, and the elastic pieces 29a accommodate any dimensional errors which may exist in the switch main body 1 and/or the outer casing 25. Thus, the accuracy of the actuation stroke of the plunger 5 may be ensured without causing any difficulty in the manufacturing and assembling processes.

The outer surface of the switch main body 1 is provided with a plurality of axially extending ridges 31 whose outer end surfaces are in contact with the inner surface of the outer casing 25.

Numeral 32 denotes a terminal base provided with a plurality of pin terminals 33. The terminal base 32 is fixedly secured to the outer casing 25 by being fitted into a mounting hole provided in the upper surface of the outer casing 25 and is connected to lead terminals 22 and 23 of the light emitting element 9 and the light receiving element 10.

The switch unit A is constructed as described above.

Figure 4:
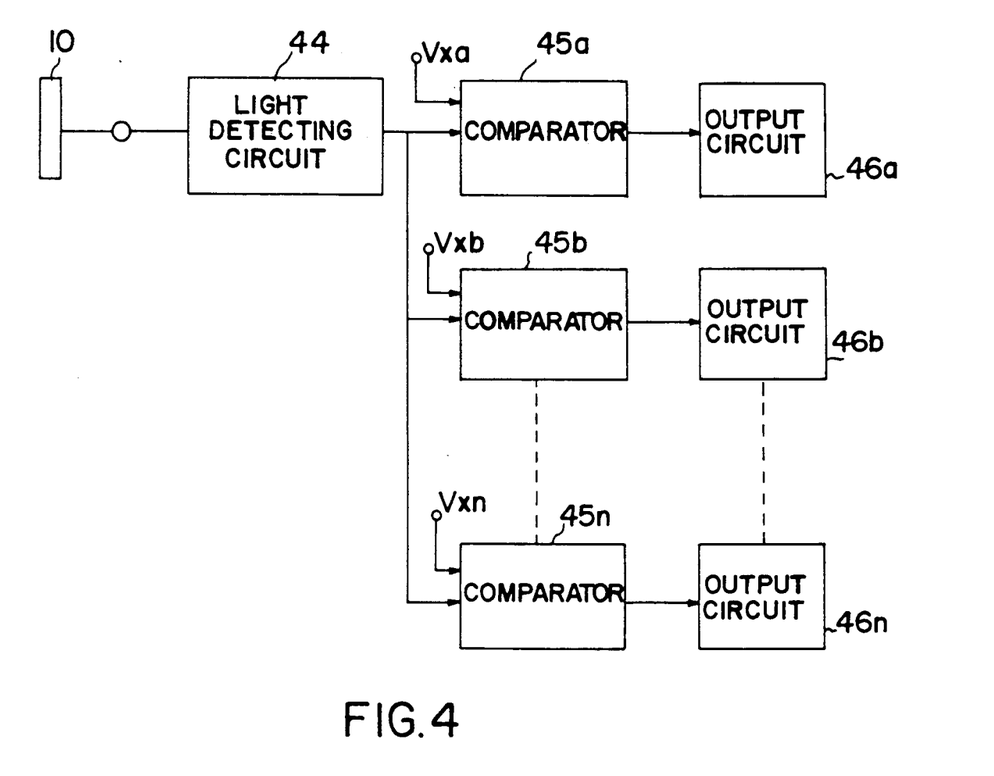
FIG. 4 is a block diagram of the signal processing circuit.

Symbol B denotes a controller unit which comprises a printed circuit board 42 fixedly secured within a casing 41 and carrying a signal processing circuit 43 as illustrated in FIG. 4. Specifically, this signal processing circuit 43 comprises a light detection circuit 44 for detecting and amplifying the output from the light receiving element 10 in the switch unit A, a plurality of comparators 45a through 45n for comparing the output V from the light detection circuit 44 with predetermined output levels Vx, and output circuits 45a through 45n for sending out detection switch outputs according to the outputs from the associated comparators 45a through 45n, and the predetermined output levels Vxa through Vxn of the comparators 45a through 45n can be adjusted. The adjustment of the predetermined output levels Vxa through Vxn may be carried out, for instance, by using adjusters 47a through 47n consisting of variable resistors mounted on the outer wall of the casing 41. In this embodiment, three such adjusters 47a through 47n are used.

Numeral 48 denotes socket terminals which can be detachably connected to the pin terminals 33 of the terminal base provided in the switch unit A, and these socket terminals 48 are retained in the casing 41 of the controller unit B. Numeral 49 denotes a signal transmission cable.

Now, the operation of the above described structure is described in the following.

The light from the light emitting element 9 passes through the ball lens 15 and is received by the light receiving element 10. When the actuation portion 5a of the plunger 5 is acted upon, the shoulder portions 17a of the lens holder 16 are pressed by the free end surfaces 7a of the elastic legs 7 of the plunger 5, and, as a result, the ball lens 15, along with the lens holder 16, is displaced rearwardly along the axial direction of the switch main body 1. The intensity or the amount of light which passes through the ball lens 15 changes with the axial displacement of the plunger 5.

Figure 3A:
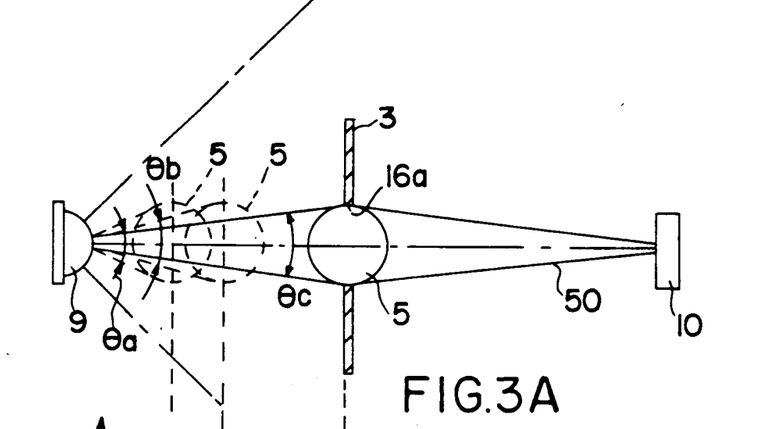
FIG. 3 is a diagram illustrating the basic principle of the operation of the contactless switch.

Specifically, as shown in FIG. 3(A), the divergent light beam 50 emitted from the light emitting element 50 is focused by the ball lens 15 and is projected upon the light receiving element 10. When the plunger 15 is displaced along with the ball lens 15 along the axial line X, the converging angle $\theta$ of the light beam 50 passing through the ball lens 15 changes. The closer the ball lens 15 is to the light emitting element 9, the larger the angle $\theta$ becomes, and the amount of the light receive by the light receiving element accordingly increases.

Figure 3B:
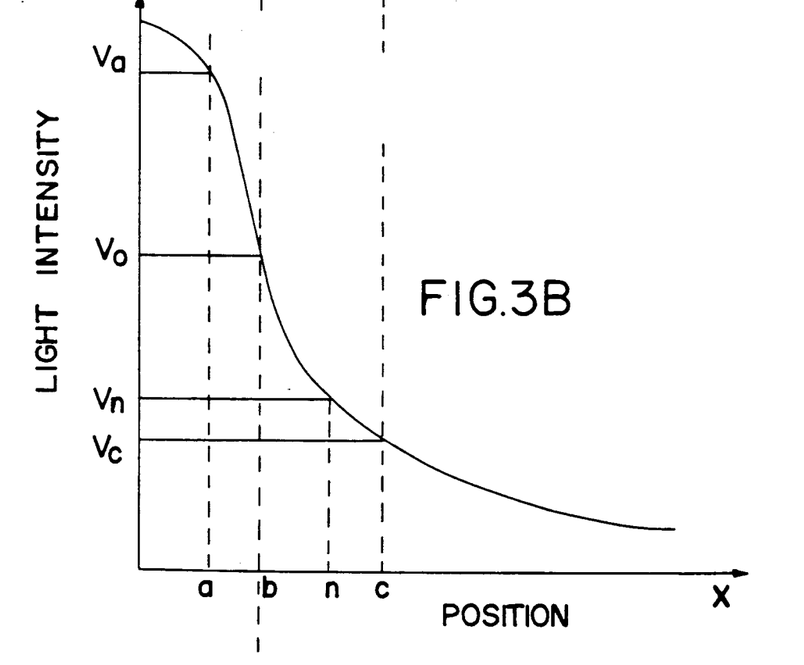

For instance, when the ball lens 15 is located at points a, b and c on the axial line X, the angle $\theta$ of the light beam 50 forcused by ball lens 15 becomes $\theta_a$, $\theta_b$ and $\theta_c$ ($\theta_a > \theta_b > \theta_c$), respectively, and the amount of the light received by the light emitting element 10 changes according to the property represented in FIG. 3(B).

Figure 3C:
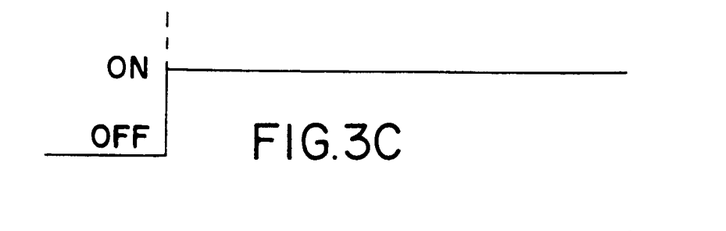

Therefore, by suitably adjusting the predetermined output level Vxb of the comparator 45b in the signal processing circuit 43 and setting the threshold level of the light receiving element at V0, an ON-Off switch output can be produced from the output circuit 13 when the ball lens 5 has reached the point b by the comparator 45b determining whether the amount of the received light is larger than the level V0 or not as shown in FIG. 3(C).

As can be undertood from the above description, since the plunger 5, the ball lens 15, the light emitting element 9 and the light receiving element 10 are arranged along the axial line X of the switch main body 1, the radial dimension of the switch main body 1 can be reduced, and a compact design is made possible.

By setting threshold levels at the levels Va, Vb, Vn and Vc by suitably adjusting the predetermined output levels Vxa through Vxn of the comparators 45a through 45b in the signal processing circuit 43 of the light receiving element 10, ON-OFF output signals may be produced to the associated output circuits 46a through 46n when the ball lens 5 is located at the positions a, b, c and n, respectively. Therefore, after this contactless switch is fixedly secured to a detection unit, it can be easily carried out to determine the points of activation of the switch output by adjusting the predetermined output levels Vxa through Vx of the comparators 45a through 45n, and this adjustment is extremely simple.

Furthermore, since the switch unit A and the controller unit B are detachably connected to each other by way of a connector 51 consisting of a terminal base 32 and socket terminals 45, it is possible to form a contactless switch having a desired number of points of activation simply changing the controller unit B without changing the switch unit A.

Since the amount of the light received by the light receiving element 10 is varied by displacing the ball lens 15 disposed between the light emitting element 9 and the light receiving element 10, a large actuation stroke can be obtained by increasing the spacing between the light emitting element 9 and the light receiving element 10.

The light emitting element 9 and the light receiving element 10 were fixedly secured to the switch main body 1 and the ball lens 15 disposed between the two elements 9 and 10 was moved by way of the moveable body assembly 18 in the above embodiment, but it is also possible to attach the light emitting element 9 to the moveable body assembly 18 without using any ball lens 15. Of course, it is also possible to fixedly secure the light receiving element 9, and carry the light receiving element 10 with the moveable body assembly 18.

If an external force is directly applied to the switch main body 1, it is inevitable that the plunger 5 and the lens holder 16 are placed under pressure through deformation of the switch main body 1, and the operation of the switch is impaired due to excessive resistance to the sliding movements and returning movements of the various parts. Also, increased frictional resistance to the plunger and other parts will reduce the service life of the switch due to accelerated wear.

Figure 5:
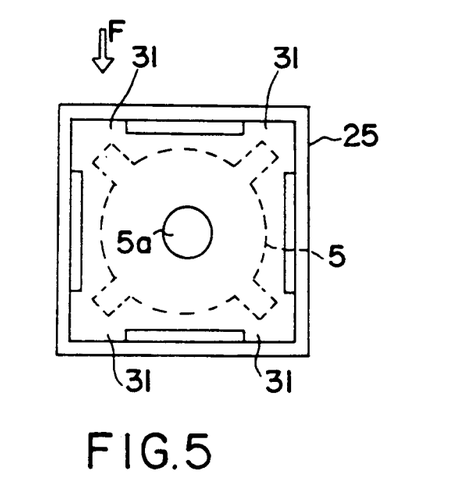
FIGS. 5 and 6 are cross sectional views of the outer housing and the inner casing, respectively.
Figure 6:
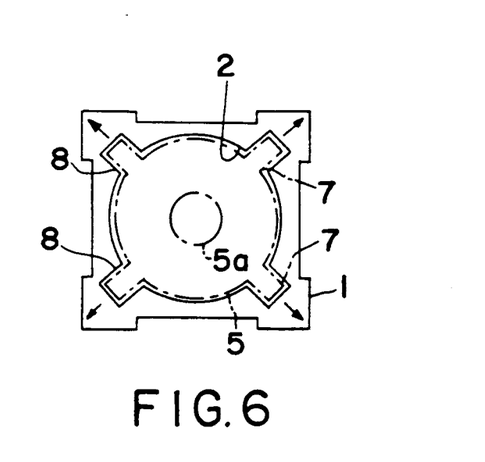
Figure 7:
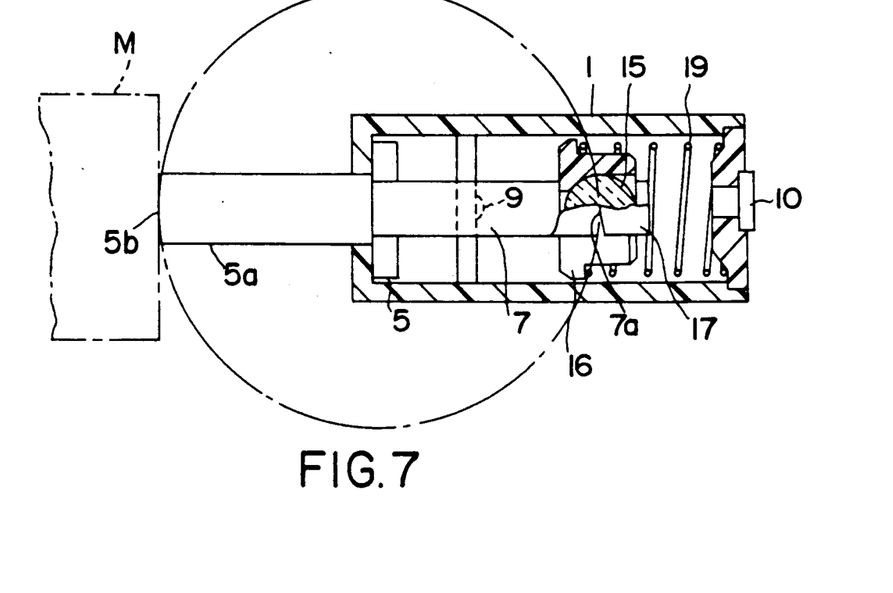
FIGS. 7 and 8 are sectional views showing different parts of FIG. 2.
Figure 8:
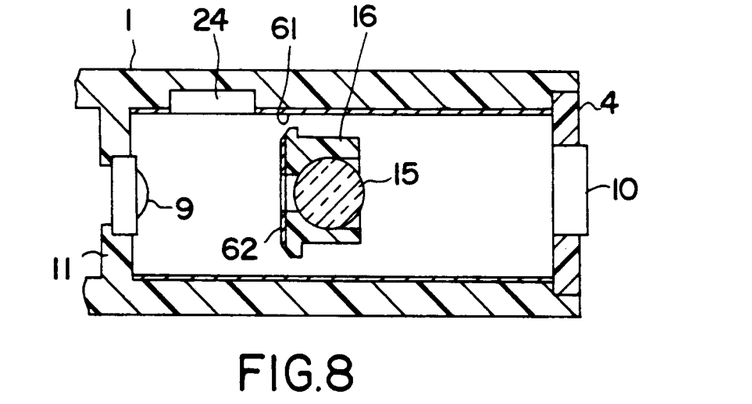
Figure 9:
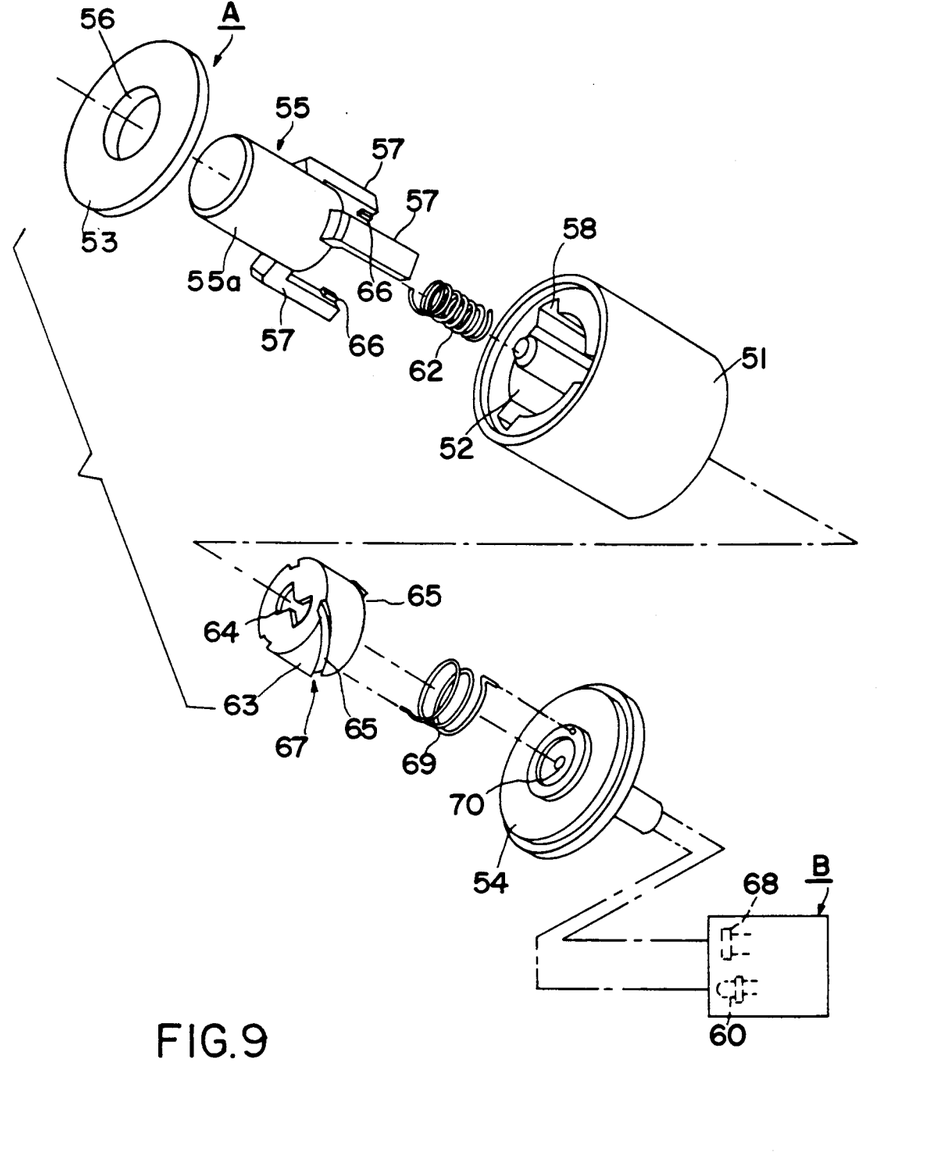
FIG. 9 is an exploded perspective view of a second embodiment of the contactless switch according to the present invention.
Figure 10:
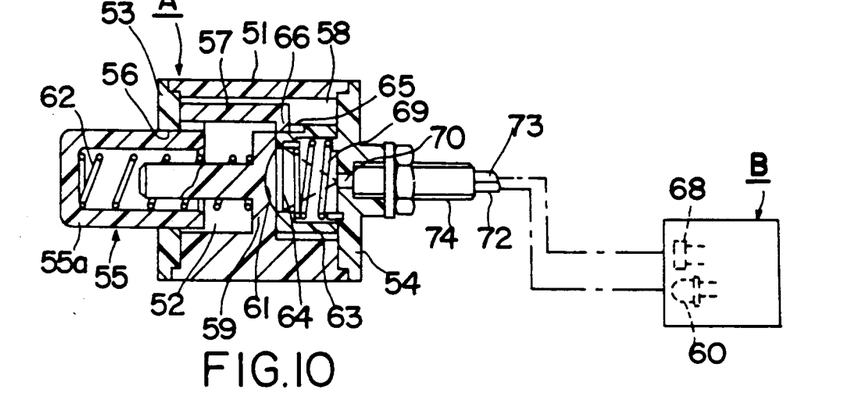
FIGS. 10 and 11 are longitudinal sectional views of the second embodiment in different states of its operation.
Figure 11:
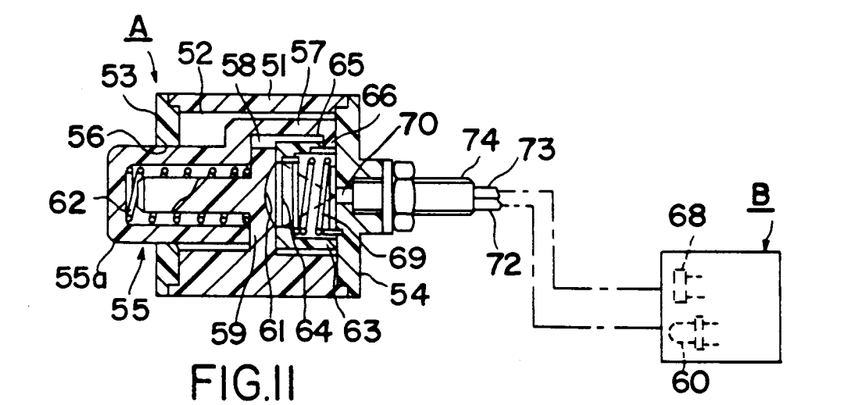
Figure 12:
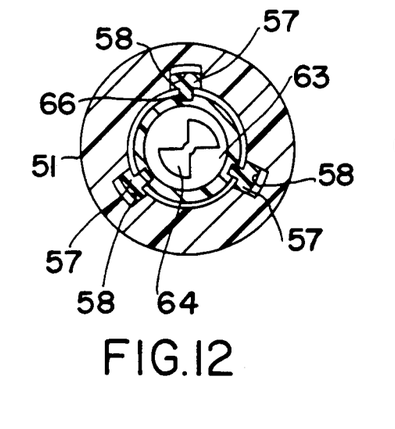
FIG. 12 is a cross sectional view of the second embodiment.

On the other hand, according to the present invention, since the switch main body 1 is fitted into the outer casing 25, and the outer surface of the switch main body 1 is provided with axial ridges 31 as shown in FIGS. 5 and 6, deformation of the switch main body 1 is prevented through the reinforcing action of the ridges 31 even when an external force F is applied thereto as shown in FIG. 5, and a favorable sliding action of the plunger 5 can be effectively ensured. Further, since the plunger 5 is not subjected to any under frictional resistance, the service life of the switch can be extended. However, it is also possible to omit the outer casing 25.

Referring to FIGS. 9 through 12, numeral 51 denotes a tubular switch main body made of synthetic resin or the like, which is provided therein with a circular bore 52 which is closed at its both axial ends by front and rear lids 53 and 54, respectively.

Numeral 55 denotes a moveable body assembly made of synthetic resin or the like which is disposed on and along the axial line of the switch main body 51. The front end of the moveable body assembly 55 is integrally provided with a columnar actuation portion 55a projecting outwardly through an opening 56 provided in the front lid 53, and four elastic legs 57 arranged at equal interval along the outer circumferential surface of the moveable body assembly 55 extend axially so as to be fitted into associated four guide grooves 58 provided in the inner circumferential surface of the switch main body 51 along the axial direction.

An axially central part of the inner wall of the switch main body 51 is provided with a partition wall 59 which permits passage of the elastic legs 57 of the moveable body assembly 55 therethrough, and the rear surface of this partition wall 59 is provided with a fan-shaped concave mirror 61 for reflecting the light from a light emitting element 60 rearwardly. Numeral 62 denotes means, such as a return coil spring which extends between the front surface of the partition wall 69 and the actuation portion 55a, for imparting a restoring force to the moveable body assembly 55.

Numeral 63 denotes a cylindrical light shield which is disposed between the partition wall 59 and the rear lid 54 so as to be rotatable around the axial line of the switch main body 51, and its front wall is provided with a slit 64 having the shape of a butterfly combining a pair of fan-shapes. The outer circumferential surface of the light shield 63 is provided with a plurality of spiral grooves 65 which mesh with projections 66 provided in the free ends of the elastic legs 57. These two parts 65 and 66 form light shield rotating means 67 for linearly changing the amount of the light reflected by the concave mirror 61 and transmitted through the slit 64 according to the axial displacement of the moveable body assembly 55. Numeral 68 denotes a light receiving element for receiving the transmitted light and producing an electric output. Numeral 69 denotes a spring extending between the light shield 63 and the rear lid 54 for preventing backlash, and numeral 70 denotes a central opening provided in the rear lid 54. The switch main body 51, the moveable body assembly 55 and the light shield 63 form a switch unit A.

Figure 13:
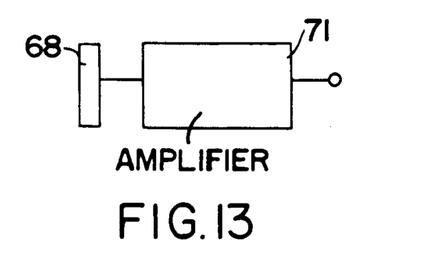
FIG. 13 is a block diagram of the signal processing circuit for the second embodiment.

Symbol B denotes a controller unit which incorporates the light emitting element 10, the light receiving element 68, and an amplifier 71 (FIG. 13) for amplifying electric signals from the light receiving element. Numeral 72 denotes an light emitting optical fiber cable for transmitting light from the light emitting element 60 to the concave mirror 61 through the central opening 70, and numeral 73 denotes another optical fiber cable or a light receiving optical fiber cable which transmits the light transmitted through the slit 64 to the light receiving element 68. A unit consisting of these optical fiber cables 72 and 73 optically couples the switch unit A and the controller unit B to each other.

Now, the operation of the above described structure is described in the following.

The light from the light emitting element 60 is projected upon the concave mirror 61 of the switch main body 51 from the central opening 70 through the light emitting optical fiber cable 72. The light reflected by the concave mirror 61 is received by the light receiving element 68 via the slit 64 of the light shield 63, the central opening 70 and the light receiving optical fiber cable 73.

When the actuation portion 55a of the moveable body assembly 55 is actuated upon, the projections 66 at the free ends of the elastic legs 57 drive the light shield 63 into an angular movement around the axial line of the switch main body 51, and the light transmitted through the slit 64 is controlled linearly.

Figure 14:
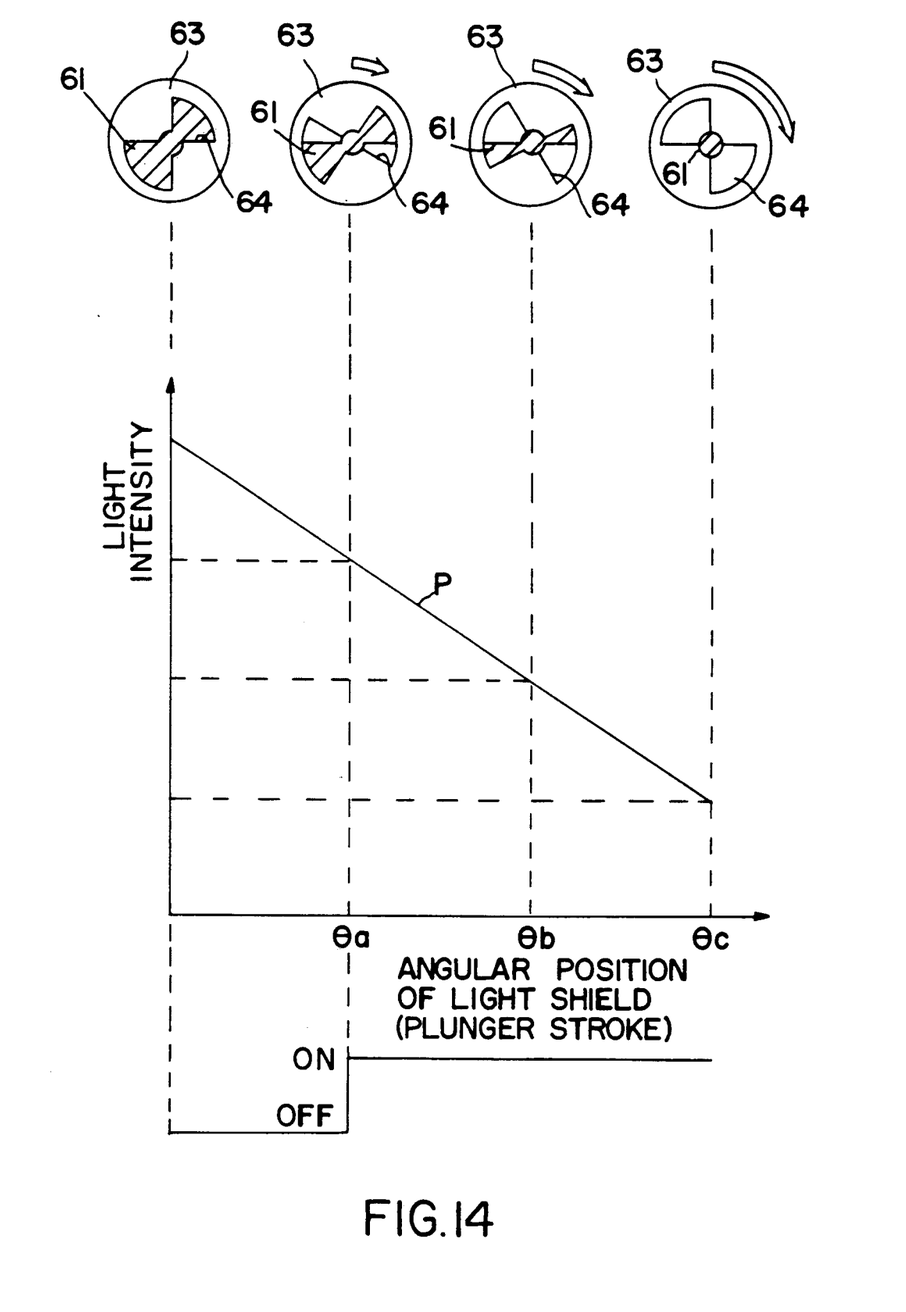
FIG. 14 is a diagram illustrating the basic principle of the operation of the contactless switch of the second embodiment.

Specifically, the angular position of the light shield 63 changes according to the axial displacement of the moveable body assembly 55 as shown in FIG. 14, and the amount of the light transmitted through the slit 64 diminishes as the rotational angle of the light shield 63 increases. Therefore, when the moveable body assembly 55 is located at points, a, b and c on the axial line of the switch main body 51, the rotational angles of the slit 64 are $\theta_a$, $\theta_b$ and $\theta_c$, respectively, and the amount of the light receiving by the light receiving element 68 changes as indicated by the line P in FIG. 14.

Therefore, in the controller unit B, by assigning a threshold level to the amount of the light received by the light receiving element 68, an ON-OFF switch output may be obtained, for instance, when the moveable body assembly 55 is located at the point a.

Since the light shield 63 which is rotatably supported around the axial line of the switch main body 51 is made to rotate by the moveable body assembly 55 which is disposed on the axial line of the switch main body 51, the radial dimension of the switch main body 51 may be made small, and a compact design is made possible.

Further, since the amount of the light transmitted through the slit 64 is linearly varied by rotating the light shield 63, by appropriately controlling the change in the rotational angle of the light shield 63 for a given change of the axial position of the moveable body assembly 55, a large actuation stroke can be achieved.

According to this embodiment, since the amount of the light transmitted through the slit 64 of the light shield 64 changes linearly with the depression stroke of the moveable body assembly 55, the signal processing circuit of the controller unit B may include only an amplifier 71 for amplifying the output from the light receiving element 68 without requiring any linearity compensation circuit, so that the circuit may be simplified and the manufacturing cost may be reduced. Furthermore, since the amount of the light transmitted through the slit 64 is varied, the individual variations of the light emitting element 60 and the light receiving element 68 would not affect the linearity property of the switch.

Figure 15:
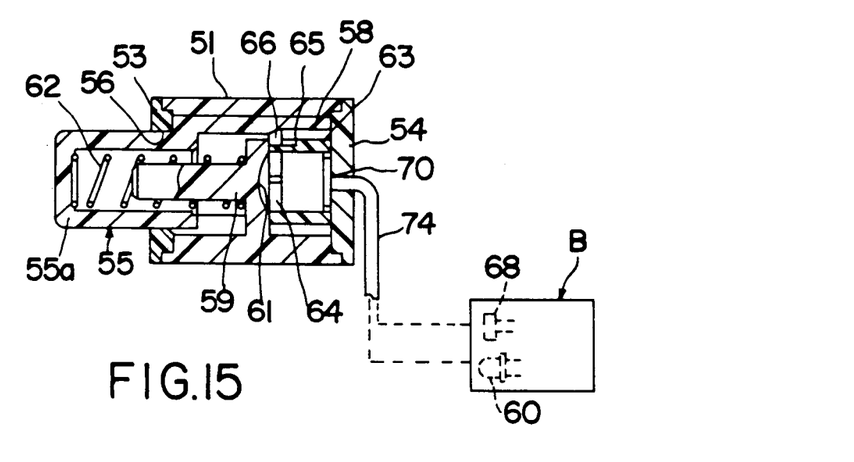
FIGS. 15 and 16 are views similar to FIGS. 10 and 11, respectively, showing a slightly modified embodiment the contactless switch according to the present invention.
Figure 16:
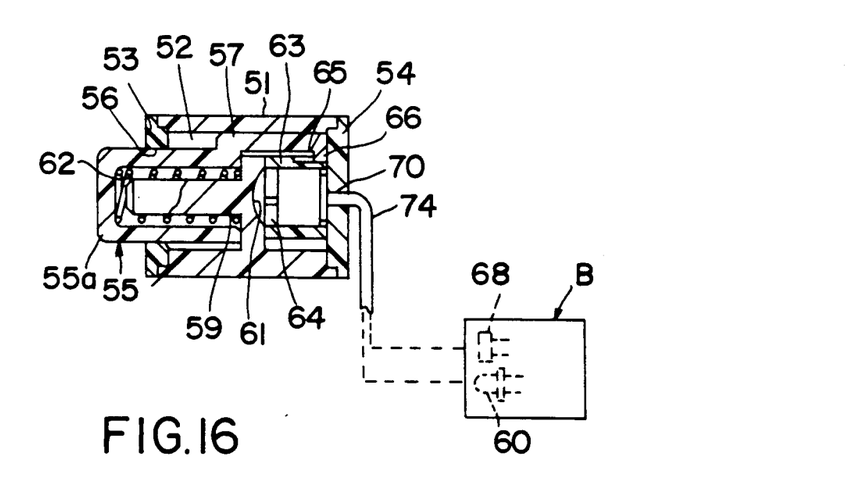

In the above described embodiment, the spring 62 was interposed between the light shield 63 and the rear lid 54 for preventing backlash, but it may be omitted as illustrated in FIGS. 15 and 16.

Although the present invention has been shown and described with respect to detailed embodiments, it should be understood by those skilled in the art that various changes and omission in form and detail may be made therein without departing from the spirit or scope of this invention.

What we claim is:

1. A contactless switch, comprising:
   a casing defining an axial bore;
   a light emitting element disposed in said bore to produce a light beam directed in an axial direction of said axial bore;
   a light receiving element disposed in said bore opposite to said light emitting element defining a certain axial space therebetween;
   a lens carrier carrying a lens element and interposed between said light emitting element and said light receiving element in an axially slidable manner; and
   a plunger member having one end projecting axially out of one of axial ends of said casing and another end engaging with said lens carrier.

2. A contactless switch according to claim 1, further comprising biasing means for urging said lens carrier towards said one axial end of said casing.

3. A contactless switch according to claim 1, wherein one of said light emitting element and said light receiving element is attached to a partition wall provided in said bore of said casing, and the other of said light emitting element and said light receiving element is attached to an end wall attached to the other axial end of of said casing, said plunger being provided with a plurality of legs which are passed through associated openings provided in said partition wall and abut peripheral parts of said lens carrier.

4. A contactless switch according to claim 3, further comprising a compression coil spring interposed between a spring seat provided in a part of said casing adjacent said other axial end of said bore, and another spring seat provided in a part of said lens carrier, said spring seat of said lens carrier being closer to said one axial end of said bore than said peripheral parts of said lens casing where said legs of said plunger abut.

5. A contactless switch according to claim 3, wherein an external end of said plunger and parts of said legs of said plunger abutting said peripheral parts of said lens carrier are located on the surface of a common imaginary sphere.

6. A contactless switch according to claim 3, wherein the inner wall surface of said casing is provided with axial grooves for guiding tabs radially projecting from said lens carrier.

7. A contactless switch according to claim 1, wherein at least a part of the inner wall surface of the casing is coated with non-reflective substance.

8. A contactless switch according to claim 1, further comprising a second light receiving element in said bore for monitoring the intensity of light emitted from said light emitting element.

9. A contactless switch according to claim 1, further comprising an outer housing for axially receiving said casing, said casing directly abutting an inner end surface of said outer housing at one of its axial ends and abutting another inner end surface of said outer housing at the other of its axial ends by way of a deformable elastic member.

10. A contactless switch according to claim 1, wherein said casing is provided with a plurality of axial ridges on its outer surface.

11. A contactless switch according to claim 1, further comprising a detachable control unit, which may be detachably coupled with a main part of the contactless switch, comprising a connector for electrically connecting with output leads of said light receiving element, a comparator for comparing an output from said light receiving element with a threshold level, and an output circuit for producing an ON-OFF signal according to an output from said comparator.

12. A contactless switch according to claim 11, wherein said comparator is provided with means for adjusting said threshold level.

13. A contactless switch according to claim 11, wherein said signal processing circuit comprises a plurality of comparators having different threshold levels and output circuits associated therewith.

14. A contactless switch according to claim 13, wherein said comparators are individually provided with means for adjusting said threshold levels.

* * * * *